(12) United States Patent
Arman et al.

(10) Patent No.: US 8,389,948 B2
(45) Date of Patent: Mar. 5, 2013

(54) AHARONOV-BOHM SENSOR

(75) Inventors: Moe J. Arman, Palmdale, CA (US); Charles Chase, Lancaster, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 57 days.

(21) Appl. No.: 13/196,841

(22) Filed: Aug. 2, 2011

(65) Prior Publication Data
US 2013/0032730 A1 Feb. 7, 2013

(51) Int. Cl.
*G01N 23/00* (2006.01)
(52) U.S. Cl. ....................................... 250/395
(58) Field of Classification Search .................... 250/395
See application file for complete search history.

(56) References Cited

U.S. PATENT DOCUMENTS

| | | | |
|---|---|---|---|
| 4,935,625 A * | 6/1990 | Hasegawa et al. | 850/9 |
| 4,957,337 A | 9/1990 | Ogawa et al. | |
| 5,091,980 A | 2/1992 | Ogawa et al. | |
| 5,153,688 A | 10/1992 | Oda et al. | |
| 5,247,223 A * | 9/1993 | Mori et al. | 313/308 |
| 5,521,735 A * | 5/1996 | Shimizu et al. | 398/212 |
| 7,038,188 B2 | 5/2006 | Beausoleil, Jr. et al. | |
| 7,042,216 B2 | 5/2006 | Barbic | |
| 7,180,580 B2 | 2/2007 | Guruprasad | |
| 7,566,897 B2 | 7/2009 | Bibilashvili et al. | |
| 7,767,976 B2 | 8/2010 | Allen et al. | |
| 7,786,472 B2 | 8/2010 | Stafford et al. | |
| 7,851,757 B2 | 12/2010 | Nagayama | |
| 2007/0194225 A1 | 8/2007 | Zorn | |
| 2008/0067561 A1 | 3/2008 | Bibilashvili et al. | |
| 2009/0168142 A1 * | 7/2009 | Nagayama | 359/279 |
| 2009/0200464 A1 | 8/2009 | Tiemeijer et al. | |
| 2009/0296258 A1 | 12/2009 | Miyanishi et al. | |
| 2010/0012827 A1 | 1/2010 | Vestergaard Hau | |

FOREIGN PATENT DOCUMENTS

| | | |
|---|---|---|
| EP | 0471288 | 2/2002 |
| WO | WO 2006/064093 | 6/2006 |

OTHER PUBLICATIONS

Arndt, et al., "Interferometry with Large Molecules: Exploration of Coherence, Decoherence and Novel Beam Methods", Brazilian Journal of Physics, Jun. 2005, pp. 216-223, vol. 35, No. 2A.
Bongs, et al., "Physics with coherent matter waves", Reports on Progress in Physics, 2004, pp. 907-963, vol. 67.
Japha, et al., "Using Time-Reversal Symmetry for Sensitive Incoherent Matter-Wave Sagnac Interferometry", Physical Review Letters, 2007, pp. 060402-1-060402-4, vol. 99.

(Continued)

*Primary Examiner* — Marcus Taningco
(74) *Attorney, Agent, or Firm* — McDermott Will & Emery LLP

(57) ABSTRACT

An Aharonov-Bohm (AB) sensor is provided. The AB sensor includes a beam splitter configured to split a first electron beam into a first wave and a second wave. The beam splitter is configured to direct the first wave along a first path through a field-free cage. A phase of the first wave is configured to shift in response to a vector potential of a signal. The vector potential is present within the field-free cage. The AB sensor includes a beam combiner configured to combine the phase shifted first wave with the second wave to generate a second electron beam, which is modulated based on the phase shift of the first wave. The AB sensor includes a detector configured to receive the second electron beam and to detect the signal based on the modulation of the second electron beam.

20 Claims, 9 Drawing Sheets

OTHER PUBLICATIONS

Ketterle, "Nobel lecture: When atoms behave as waves: Bose-Einstein condensation and the atom laser", Reviews of Modern Physics, Oct. 2002, pp. 1131-1151, vol. 74.

Lin, et al., "Cloaking of matter waves under the global Aharonov-Bohm effect", Physical Review A, May 27, 2009, pp. 051605-1-051605-4, vol. 79.

Caprez, Adam, et al., "Macroscopic Test of the Aharonov-Bohm Effect," Physical Review Letters, Nov. 2007, vol. 99, pp. 210401-1-210401-4.

Chirolli, L., et al. "Electronic implementations of interaction-free measurements", Physical Review B, Jul. 2010, vol. 82, pp. 045403-1-045403-11.

Edgcombe, C J, "A phase plate for transmission electron microscopy using the Aharonov-Bohm effect", Journal of Physics: Conference Series 241, 2010, pp. 1-4.

Hod, Oded, "Molecular Nano-electronic Devices Based on Aharonov-Bohm Interferometry", Thesis submitted to the Senate of Tel-Aviv University, Oct. 2005.

Sato, Yuki, et al. "On the feasibility of detecting an Aharonov-Bohm phase shift in neutral matter", Journal of Physics: Conference Series 150, 2009, pp. 1-4.

Tonomura, Akira, "The AB effect and its expanding applications", Journal of Physics A: Mathematical and Theoretical, vol. 43, Aug. 2010, pp. 1-13.

* cited by examiner

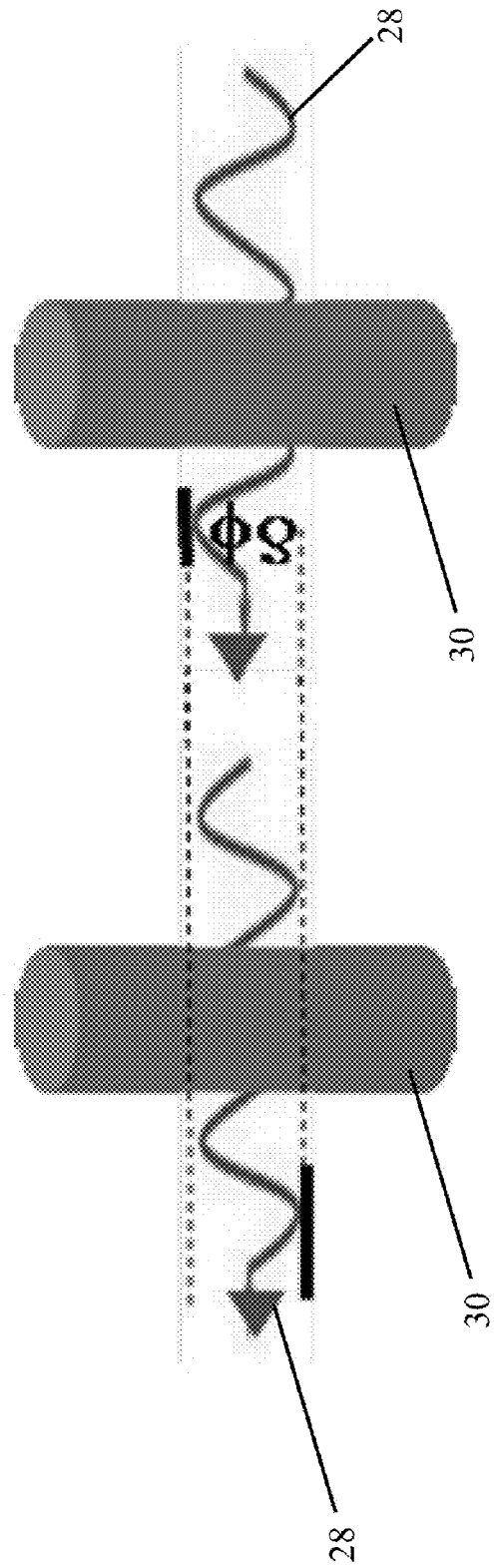

AHARONOV-BOHM SENSOR

STATEMENT AS TO RIGHTS TO INVENTIONS MADE UNDER FEDERALLY SPONSORED RESEARCH OR DEVELOPMENT

Not Applicable.

FIELD

The subject technology generally relates to sensors and, in particular, relates to Aharonov-Bohm (AB) sensors.

BACKGROUND

Energy is typically exchanged between a sensor and a signal (e.g., an electric, magnetic, or electromagnetic signal) being detected by the sensor. This exchange of energy may put a limit on how weak the signal can be and still be detected. The exchange of energy may also modify or destroy the signal. Thus, what is observed is not necessarily the original signal that is desired to be detected.

SUMMARY

Aspects of the subject technology provide a way to detect a signal without modifying the signal, and without a limit on how weak the signal can be to be detected. In some aspects, a quantum mechanical method using the Aharonov-Bohm (AB) effect is provided for detecting/sensing a signal without exchanging energy and/or any other physical quantity with the signal. According to the AB effect, the angular phase of a particle inside a vector potential of a signal can change even if the actual fields embodying the signal are zero. This effect may occur without the exchange of any physical quantity, and may be based solely on geometrical characteristics of the signal. Based on the AB effect, energy-exchange-free sensors may detect a signal without disturbing the signal itself, even if the signal is too weak to be detectable by other conventional methods (e.g., six orders of magnitude weaker than conventional methods).

According to various aspects of the subject technology, an Aharonov-Bohm (AB) sensor is provided. The AB sensor comprises a beam splitter configured to split a first electron beam into a first wave and a second wave. The beam splitter is further configured to direct the first wave along a first path through a field-free cage. A phase of the first wave is configured to shift in response to a vector potential of a signal, wherein the vector potential is present within the field-free cage. The AB sensor also comprises a beam combiner configured to combine the phase shifted first wave with the second wave to generate a second electron beam. The second electron beam is modulated based on the phase shift of the first wave. The AB sensor also comprises a detector configured to receive the second electron beam and to detect the signal based on the modulation of the second electron beam.

According to various aspects of the subject technology, a method for detecting a signal is provided. The method comprises splitting a first electron beam into a first wave and a second wave. The method also comprises directing the first wave along a first path through a field-free cage. A phase of the first wave is configured to shift in response to a vector potential of a signal, which is present within the field-free cage. The method also comprises directing the second wave along a second path, and combining the phase shifted first wave from the first path with the second wave from the second path to generate a second electron beam. The second electron beam is modulated based on the phase shift of the first wave. The method also comprises detecting the signal based on the modulation of the second electron beam.

According to various aspects of the subject technology, an AB sensor is provided. The AB sensor comprises a beam splitter configured to split a first electron beam into a first wave and a second wave. The beam splitter is further configured to direct the first wave along a first path through a field-free cage and to direct the second wave along a second path. A phase of the first wave is configured to shift in response to a vector potential of a signal, which is present within the field-free cage. The AB sensor also comprises a vacuum housing. The first path and the second path are disposed within the vacuum housing. The vacuum housing is sized such that a coherence length of each of the first wave and the second wave when directed along the first path and the second path, respectively, is at least 1 millimeter. The AB sensor also comprises a beam combiner configured to combine the phase shifted first wave from the first path with the second wave from the second path to generate a second electron beam. The second electron beam is modulated based on the phase shift of the first wave. The AB sensor also comprises a detector configured to receive the second electron beam and to detect the signal based on the modulation of the second electron beam.

Additional features and advantages of the subject technology will be set forth in the description below, and in part will be apparent from the description, or may be learned by practice of the subject technology. The advantages of the subject technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

FIGS. 5A and 5B illustrate an example of a wave of a particle propagating in the presence of a potential, in accordance with various aspects of the subject technology.

DETAILED DESCRIPTION

Figure 1B:
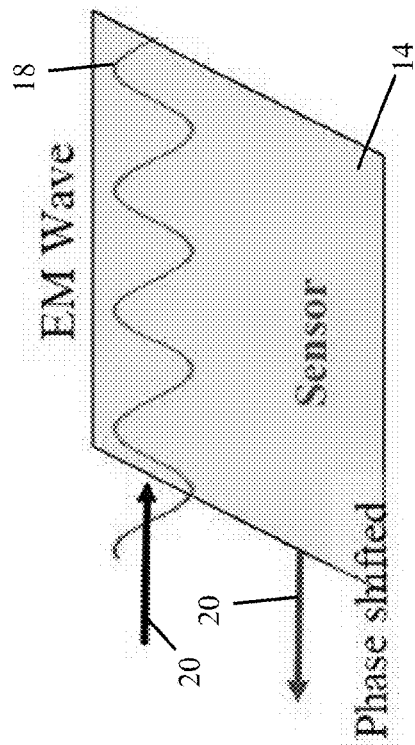
FIGS. 1A and 1B illustrate a comparison between a classical sensor and a quantum sensor, in accordance with various aspects of the subject technology.

In the following detailed description, numerous specific details are set forth to provide a full understanding of the subject technology. It will be apparent, however, to one ordinarily skilled in the art that the subject technology may be practiced without some of these specific details. In other instances, well-known structures and techniques have not been shown in detail so as not to obscure the subject technology.

The Aharonov-Bohm (AB) effect is a remarkable quantum mechanical phenomena that predicts that when a charged particle moves in a vector potential of a signal, a phase of its wave may be affected even if the fields of the signal are zero. Aspects of the subject technology utilize this effect to influence the state of a particle even if no forces are present or are acting on the particle.

The promise of the AB effect is that it makes the interaction of two physical entities possible without the exchange of any physical quantities. This effect has far-reaching consequences in theoretical physics as well as in technological applications. When the AB effect is utilized with a sensor, there may virtually be no lower limit on how weak a signal can be and still be detectable. For example, compared to conventional methods, a six order of magnitude enhancement in the detection threshold of a signal can be achieved. Furthermore, a quantity can be measured without disrupting the quantity in the measuring process. The AB effect is also extremely strong; the effect/cause ratio may be several orders of magnitude larger than typical electromagnetic effects, which is a strong indication of an extremely large signal to noise ratio in detection.

One difficulty with developing a sensor based on the AB effect is that a very short coherence length of electron beams may be needed to measure the phase shift involved. Aspects of the subject technology address this problem and provide a quantum sensor that is more sensitive than conventional sensors (e.g., six orders of magnitude more sensitive), capable of measuring a signal without modifying the effect being measured (which is a common occurrence with conventional sensors), and is miniaturizable (the quantum nature of the AB effect makes it possible to miniaturize the quantum sensor for integration in microstructures).

According to various aspects of the subject technology, an AB sensor is provided that utilizes two coherent beams of electrons, wherein the phase of one of the beams may be shifted as a result of the presence of a signal to be detected. This phase shift may be proportional to the magnitude of the signal to be detected. The two beams, which may have coherence lengths long enough for detection, may be produced with an intensity high enough for detection. The beams may propagate in vacuum. In some aspects, coherence may be established for individual electrons, as opposed to the beams. The principle behind the AB sensor is that the interaction between the coherent beam and the signal is non-intrusive and does not involve energy exchange. This interaction may modify the phase of the coherent beam in proportion to the magnitude of a potential that is present. In some aspects, the phase shift is a measure of the field of the signal being detected.

Applications of the AB sensor may include spy-craft applications, non-invasive behind-the-wall observation, remote sensing, high frequency and very high frequency direction finding, small antenna applications for low radio frequency, and other suitable applications. The AB sensor may have an unprecedented level of sensitivity, thereby opening the door to many unexplored territories in theoretical and experimental space. Many high precision measurements that were considered beyond the reach of conventional technologies may now become possible.

The level of sensitivity afforded by the AB sensor is due in part to the fact that the AB effect deals with potentials and not fields. Fields are local entities specific to a point. Potentials, on the other hand, are extended entities influenced by the entire system. The information contained in potentials may include phase information, which may be what distinguishes quantum mechanics from classical mechanics. Many restrictions and limitations dictated by classical mechanics do not apply to quantum mechanics due to the infinitesimal nature of quantum effects. Table 1 below compares some practical advantages of the AB effect over non-quantum effects.

| Physics | Property | | | |
|---|---|---|---|---|
| | Strength Arbitrary units | Sensitivity Arbitrary units | Signal to Noise Ratio | Quantum Efficiency Arbitrary units |
| Classical | 1.0 | 1.0 | 1.0 | N/A |
| Quantum | $10^6$ | $10^5$ | $10^5$ | Varies with $\lambda$, ~1. |

Conventional electromagnetic field sensor technology may be based on an interaction between a sensing device and a medium to be sensed. The interaction involves an exchange of a physical quantity, usually the energy of the medium, and the flow of this exchange is from the medium to the sensing device. A sensitive sensor may be one that minimizes the amount of energy exchanged for sensing. Since the energy exchanged comes from the very medium that is being sensed, not only does the energy exchange modify the quantity being sensed, but it also puts a limit on the sensitivity of the sensing device being used. The sensitivity of the device may be limited by the energy available in the medium to be exchanged. If the medium is too weak, not enough energy can exchange to trigger the sensing. In other conventional electromagnetic sensors, energy may not be the quantity exchanged, but a loss of the energy is always involved in the interaction that leads to the sensing.

Figure 1A:
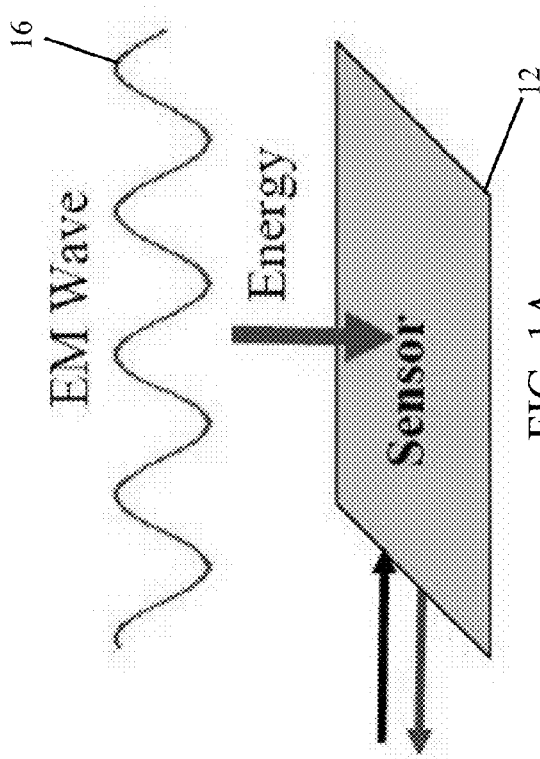

Phase modulation, on the other hand, does not necessarily involve energy exchange. While physical phase modulations may involve energy exchange and suffer from the limiting aspects described above, geometrical phase modulations do not necessarily involve energy exchange. In geometrical phase modulations, there may be no limit to the amount of sensitivity that can be achieved other than the Heisenberg uncertainty principle. FIGS. 1A and 1B illustrate a comparison between classical sensor 12 and quantum sensor 14, in accordance with various aspects of the subject technology. A physical quantity (e.g., energy) is exchanged between electromagnetic (EM) wave 16 and classical sensor 12 when classical sensor 12 is used to sense EM wave 16. In contrast, there is no energy exchange between quantum sensor 14 and EM wave 18. One manifestation of the AB effect is that the presence of a signal such as EM wave 18 may modify the geometry of the space in which sensing takes place, thereby spawning a phase shift in the wave of particles 20 used in sensor 14. This is a quantum phenomenon that may be unachievable in the classical sense.

Figure 2:
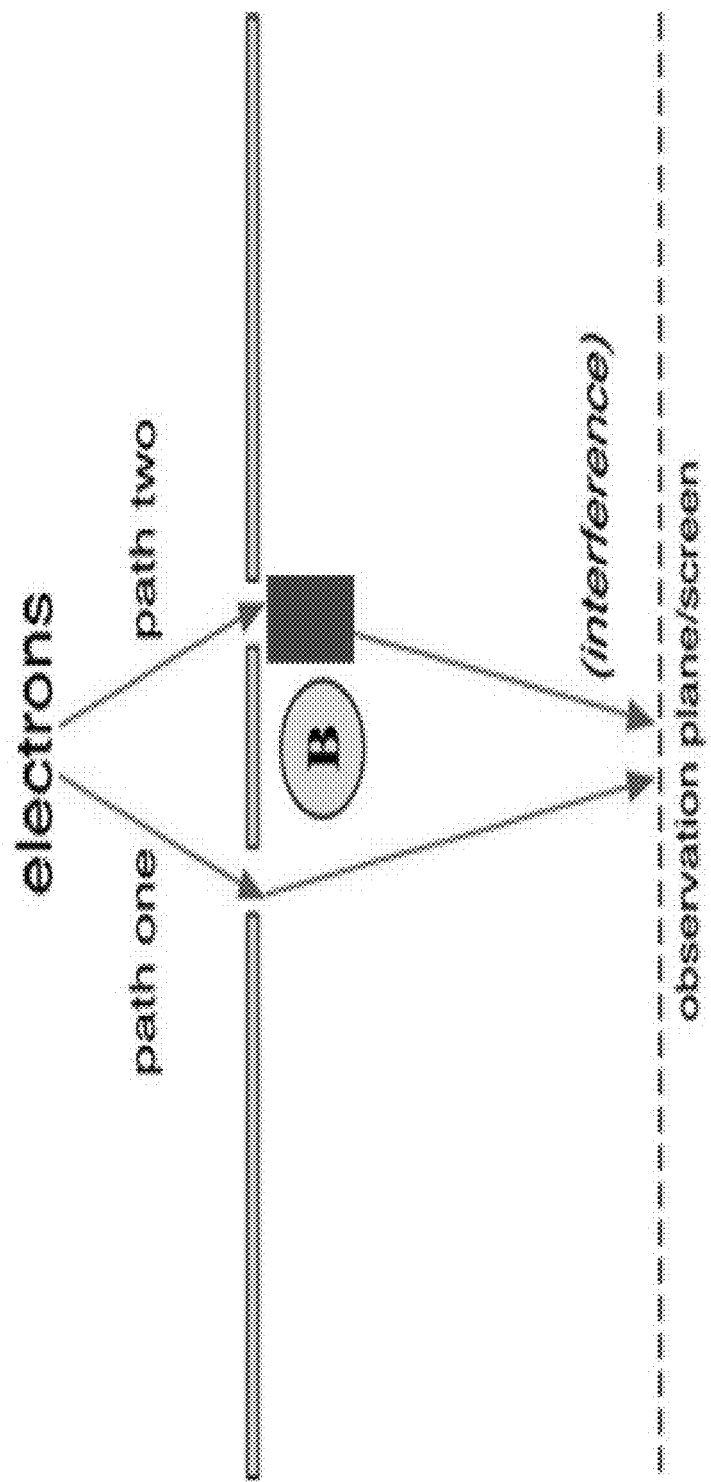
FIGS. 2 and 3 illustrate experiments demonstrating the AB effect, in accordance with various aspects of the subject technology.
Figure 3:
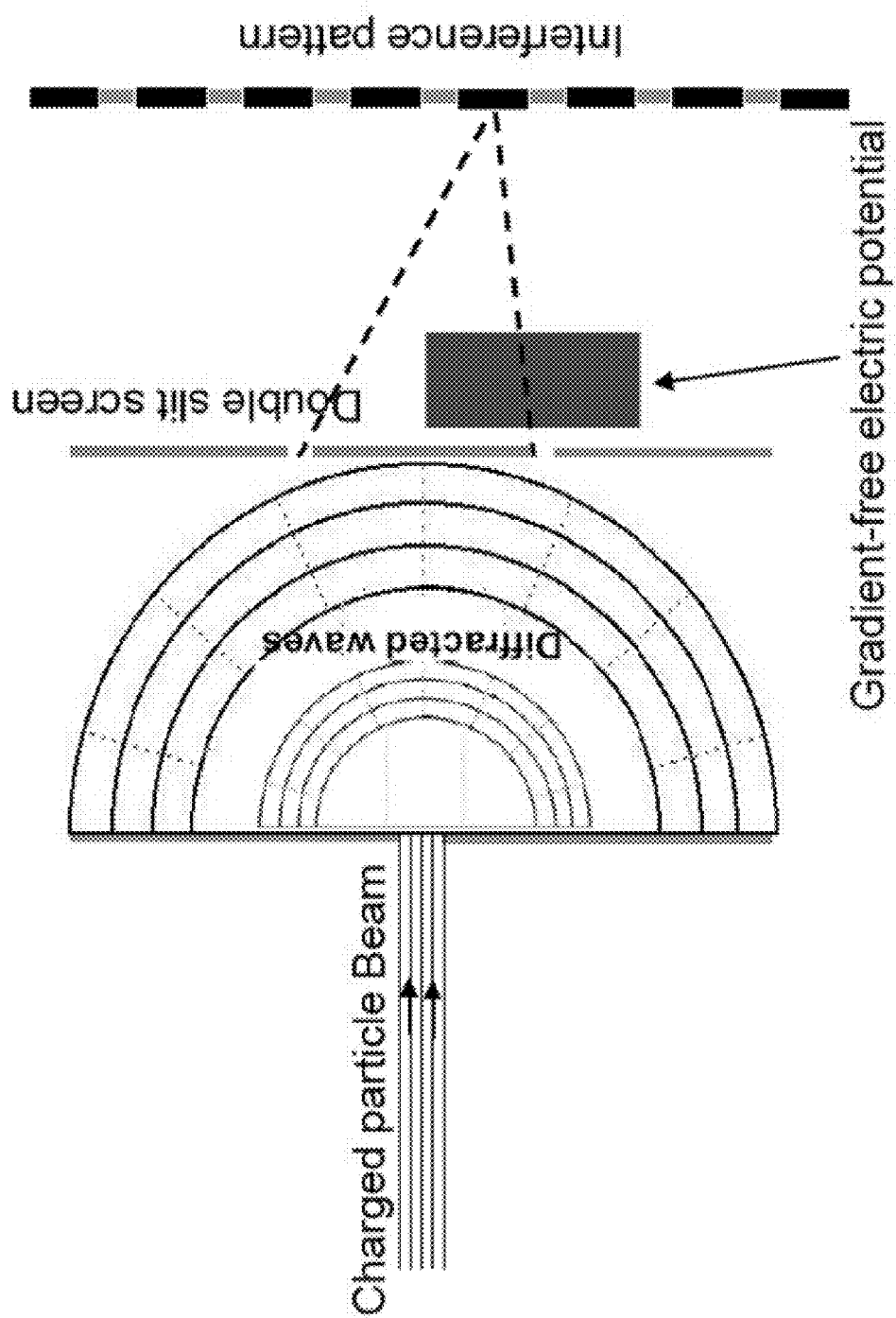

FIGS. 2 and 3 illustrate experiments demonstrating the AB effect, in accordance with various aspects of the subject technology. Two coherent particle beams such as electron beams are directed toward the same area to be combined, wherein one of the beams is subjected to a zero-field vector potential that may shift the phase of the corresponding beam. The phase shift can then be measured in the interference pattern that results when the two beams interact.

Conventional EM sensors may measure electric field, magnetic field, the product of the two fields (e.g., Pointing vector), or the time derivatives thereof. In these cases, the quantity being sensed is a field, or a combination of fields. Furthermore, the interaction that makes the sensing possible entails the exchange of a physical quantity (e.g., energy, momentum, charge, angular momentum, etc.). These two points impose severe limitations on what can be sensed, where the sensing is possible, and how sensitive the sensing can be.

Fields are derivatives of potentials, and are local quantities. Fields contain the information about a single point at a single time. In order to collect information for an extended area, many measurements may need to be taken. On the other hand, phase modulating sensors such as an AB sensor do not necessarily need fields to operate. These sensors may sense potentials, a quantity representative of a space and not a point. For applications in the classical world, this extended information may need to be reduced to a point, but for use in subsequent quantum scenarios, the ability to sense potentials may be a powerful advantage. Furthermore, phase modulating sensors do not involve the exchange of physical quantities, thereby allowing the phase modulating sensors to be more sensitive in detecting weak signals.

The inability of conventional sensors to achieve the sensitivity of phase modulating sensors may stem from the fact that classical mechanics is intrinsically unaware of phase information in solving physical problems. The phase information is imbedded in the Lagrangian used in the formulation of the equation of motion in quantum mechanics, and gets lost in the classical limit when amplitudes are squared to find probabilities. Another way of realizing this loss of phase information is to remember that in quantum mechanics, entities may be considered waves and have phases. In classical mechanics, particles are approximated by points with no phase or extension. With no extension, these particles do not possess phase.

Figure 4B:
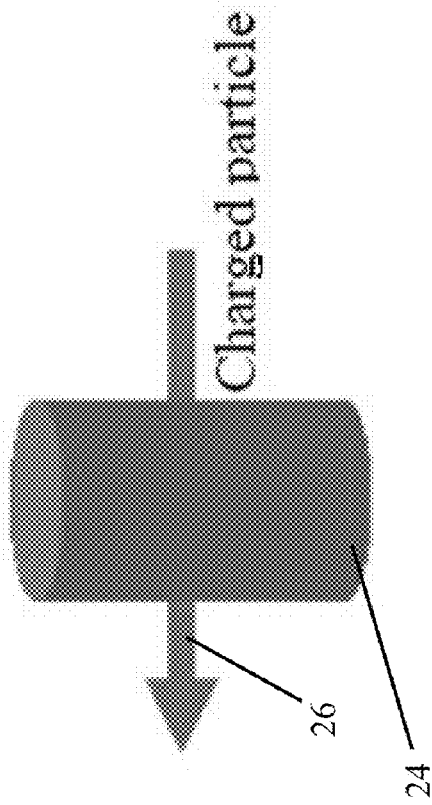
FIGS. 4A and 4B illustrate an example of a charged particle being affected by a field.
Figure 4A:
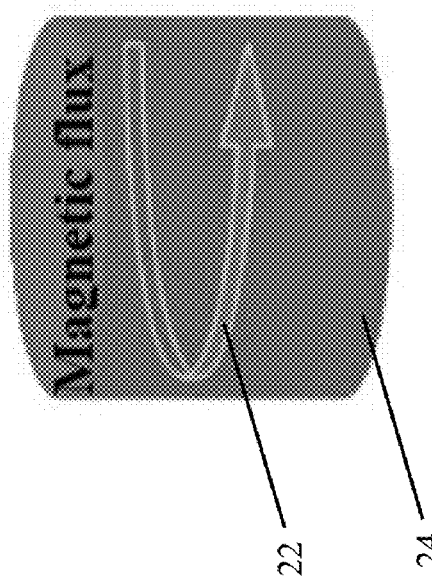

FIGS. 4A and 4B illustrate an example of a charged particle being affected by a field. When the charged particle, such as an electric charge, moves in magnetic field 24 (e.g., along path 22), Lorentz forces may modify the path of the charge and the charge will move in a curve. Classically, when the charge moves outside magnetic field 24 (e.g., along path 26), the charge continues on a straight line, and no observable change in the state of the charge is expected.

FIGS. 5A and 5B illustrate an example of wave 28 of a particle propagating in the presence of potential 30, in accordance with various aspects of the subject technology. Quantum mechanically, the phase $\delta\phi$ of wave 28 is affected in the presence of potential 30 (e.g., curl free vector potential), even if there is no field or force present.

The phase acquired by a charged particle moving in a magnetic vector potential is a function of the potential and in SI units, is given by:

$$\phi = \frac{q}{\hbar}\int_P A \cdot dx, \quad (1)$$

where q is the charge, A is the vector potential, and the integral is carried out along a curve containing the potential. $\phi$ may be an important part of any quantum mechanical description of a system. In some aspects, $\phi$ is purely quantum mechanical, with no counterpart in classical physics. It enters as an exponent in the wave function of a system and drops out when the wave function is squared to calculate probabilities in the classical limit:

$$\psi = e^{i\phi}f(x, t) \rightarrow |\psi|^2 = |e^{i\phi}f(x, t)|^2 = |f(x, t)|^2 \quad (2)$$

The phase information is contained in the Lagrangian formulation of a system and, classically, gauge invariance may guarantee that the phase can be changed without changing the classical physics of the system, making the phase irrelevant in classical physics. The mathematics involved in calculating the phase shift is provided in more detail below.

Figure 6:
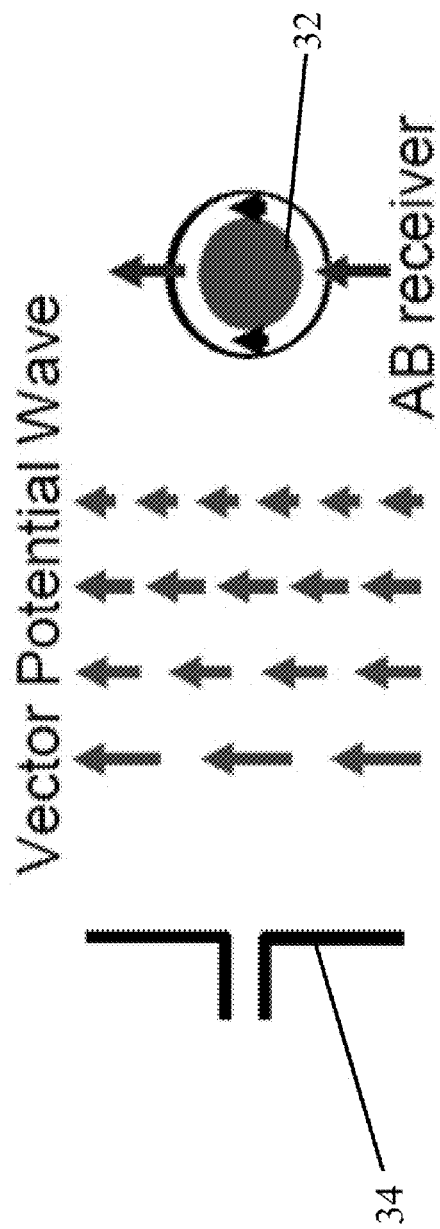
FIG. 6 illustrates an example of an AB sensor arranged near a dipole source, in accordance with various aspects of the subject technology.

To calculate the phase shift associated with a planar signal from a dipole source, equation (2) may be integrated along a closed curve. FIG. 6 illustrates an example of AB sensor 32 arranged near dipole source 34, in accordance with various aspects of the subject technology. Assuming AB sensor 32 is at the origin and dipole source 34 at (−d, 00) coordinates, the vector potential component may be calculated and the line integral may be carried out. After a few simplifying assumptions, the following may be obtained:

$$\Delta\phi = -i(\mu_0\omega/2)Pe^{ikd}(r/d)(\pi r/\lambda) + O((r/d)^2), \quad (3)$$

Equation (3) shows that $\Delta\phi$, to the first order, is proportional to the potential amplitude P and inversely proportional to the distance d. More importantly, equation (3) shows that a minute potential of only 1 nano-volt and an interaction period of 1 millisecond may produce a huge phase shift of $\pi/2$ radian. The effect/cause ratio may be six orders of magnitude larger than typical EM interactions. This means the signal, even without amplification, may stand out orders of magnitude above noise, thereby providing a signal to noise ratio unprecedented in sensor technology. This is also a strong indication of a large quantum efficiency derivable from the analysis given in the mathematics provided below.

In using the phase shift for the purpose of materializing quantum sensors, a means for measuring the phase shift may be needed, which can be challenging. To measure a phase shift of a particular wave, the wave is contrasted with another wave whose phase is known. However, since measuring the phase shift is desired, a comparison between the unaffected wave and the affected wave can be used to measure the phase shift. According to certain aspects, beam splitting may be used to produce two coherent beams of identical phase. One beam may be exposed to the medium being sensed while keeping the other beam away from the medium. In some aspects, both beams may be exposed to the medium but in opposing directions. This may produce two shifts of opposite signs, doubling the effect.

However, the beam splitting and contrasting may be marred by certain challenges, making it difficult to build and use an AB sensor. One challenge lies in preparing a coherent beam of charged particles, which typically requires near-zero temperatures, and as a result, cryogenics may need to be utilized. Another challenge is that the coherence length of the beams (e.g., the distance over which the beams remain coherent) is, depending on the wavelength, exceedingly short, thereby making operation of the AB sensor difficult to materialize even with a nanostructure approach.

Both of the foregoing challenges stem from the rather strong tendency of coherent beams towards decoherence, caused by collision of beam particles with other particles. The phase information of a coherent beam, a quantum mechanical trait, can be lost due to decoherence. This tendency towards decoherence may remain strong for as long as the coherent beams (e.g, electric currents) travel inside conductors. The motion of a coherent beam inside superconductors is less subject to decoherence and more likely to preserve its coherence longer.

Aspects of the subject technology overcome the foregoing challenges by isolating the coherent beams from the outside world. This can be done, for example, by propagating the coherent beams in a vacuum. In doing so, the wave associated with a single electron may be split into two coherent beams, which can then be passed in opposite sides of a medium to be sensed and recombined to interfere.

Figure 7:
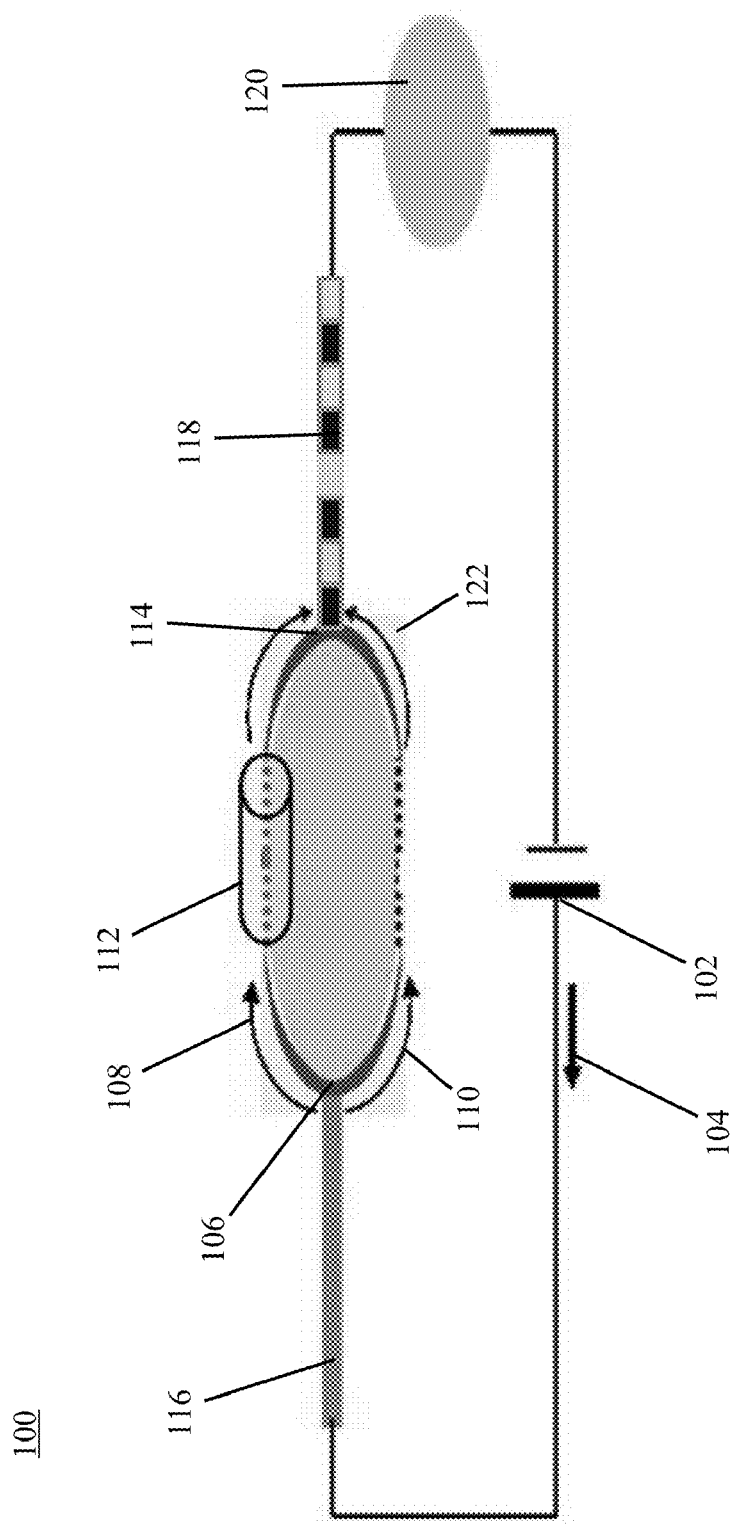
FIG. 7 illustrates an example of an AB sensor, in accordance with various aspects of the subject technology.

FIG. 7 illustrates an example of AB sensor 100, in accordance with various aspects of the subject technology. AB sensor 100 comprises beam generator 102, beam splitter 106, field-free cage 112, beam combiner 114, vacuum housing 122, and detector 120. Beam generator 102 is configured to generate a first electron beam 116 that propagates in the direction illustrated by arrow 104. Beam splitter 106 is configured to split first electron beam 116, one electron at a time, into a first wave and a second wave. First electron beam 116 comprises a superposition of the first wave and the second wave. Beam splitter 106 is configured to direct the first wave along first path 108 and the second wave along second path 110. By separating first electron beam 116 into the first wave and the second wave, the first wave can be exposed to a vector potential of a signal to be detected, thereby causing the phase of the first wave to shift. The second wave is not exposed to the vector potential and remains unaffected, which allows the first wave to be compared to the second wave to determine the amount of phase shift caused by the vector potential.

Beam combiner 114 is configured to combine the phase shifted first wave with the second wave to generate second electron beam 118, which is modulated based on the phase shift of the first wave. For example, the amplitude of second electron beam 118 may be a function of the phase shift. Detector 120, which can be any suitable observation device, is configured to receive second electron beam 118 and to detect the signal based on the modulation of second electron beam 118. Utilizing the AB effect, AB sensor 100 is able to detect the signal without modifying an energy (or some other physical quantity) of the signal.

According to certain aspects, field-free cage 112 is coupled to beam splitter 106. Beam splitter 106 is configured to direct the first wave along first path 108 through field-free cage 112. When the vector potential of the signal is present within field-free cage 112, the phase of the first wave is configured to shift in response to the vector potential according to the AB effect. Field-free cage 112 is configured to exclude at least one of an electromagnetic field, an electric field, and a magnetic field external to the field-free cage. This may ensure that other fields will not affect the phase of the first wave.

Aspects of the subject technology provide a way to preserve the coherence between a wave function of the first wave and a wave function of the second wave. When electrons propagate through a medium such as air, the electrons may collide with other particles, which may cause the electrons to lose their phase dependence on one another. Conventional methods of addressing this problem involve using cold metal as a medium to propagate the electrons. However, cryogenics are often needed to maintain a cold temperature (e.g., near zero Kelvin) for the metal. Aspects of the subject technology provide a way to preserve the coherence of the electrons without the use of cryogenics. In some aspects, the coherence may be preserved even in room temperature (e.g., between about 15 degrees Celsius and about 25 degrees Celsius). The coherence may be preserved, for example, by using vacuum housing 122.

According to certain aspects, vacuum housing 122 is configured to substantially preserve a phase dependence between a wave function of the first wave and a wave function of the second wave when the first wave and the second wave propagate along first path 108 and second path 110, respectively, in room temperature and without using cryogenics. AB sensor 100 does not require cryogenics because first electron beam 116 is split one electron at a time, and the path of these electrons is within the vacuum of vacuum housing 122, where there will be no thermal disruptions (e.g., zitterbewegung) from other electrons. For example, first path 108, second path 110, field-free cage 112, beam splitter 106, and beam combiner 114 are disposed within vacuum housing 122. This allows the first wave and the second wave to propagate through a vacuum within vacuum housing 122, thereby allowing the phase dependence between the wave function of the first wave and the wave function of the second wave to be preserved.

In some aspects, vacuum housing 122 may be sized such that a coherence length of each of the first wave and the second wave is long enough for the phase of the first wave to be shifted and for the phase shifted first wave and the second wave to be combined without losing coherence. In some aspects, the coherent length is a distance over which the wave function of the first wave and the wave function of the second wave remain phase dependent on one another. For example, vacuum housing 122 may be sized such that the coherence length of each of the first wave and the second wave when directed along first path 108 and second path 110, respectively, is at least 1 millimeter, 1 centimeter, or any other suitable length to allow the first wave to be phase shifted and then combined with the second wave without losing coherence. In some aspects, vacuum housing 122 may be small (e.g., less than 0.1 cubic centimeters) and does not require an active vacuum system, thereby allowing AB sensor 100 to be small and compact.

Although AB sensor 100 is shown as having the first wave being exposed to the vector potential, the second wave may also be exposed to the vector potential but in an opposite direction, in accordance with various aspects of the subject technology. For example, the second wave may also be directed through field-free cage 112, and the phase of the second wave is configured to shift in response to the vector potential in a direction opposite to the phase of the first wave. Exposing the second wave to the vector potential in this manner may double the phase shift between the first wave and the second wave, thereby making it easier to identify the modulation of second electron beam 118.

AB sensor 100 may be miniaturized for various intelligence applications. For example, AB sensor 100 may be less than a size of a cell phone or a coin depending on the application. AB sensor 100 may also be powered by any suitable energy harvesting means, such as being powered off of ambient EM radiations.

Figure 8:
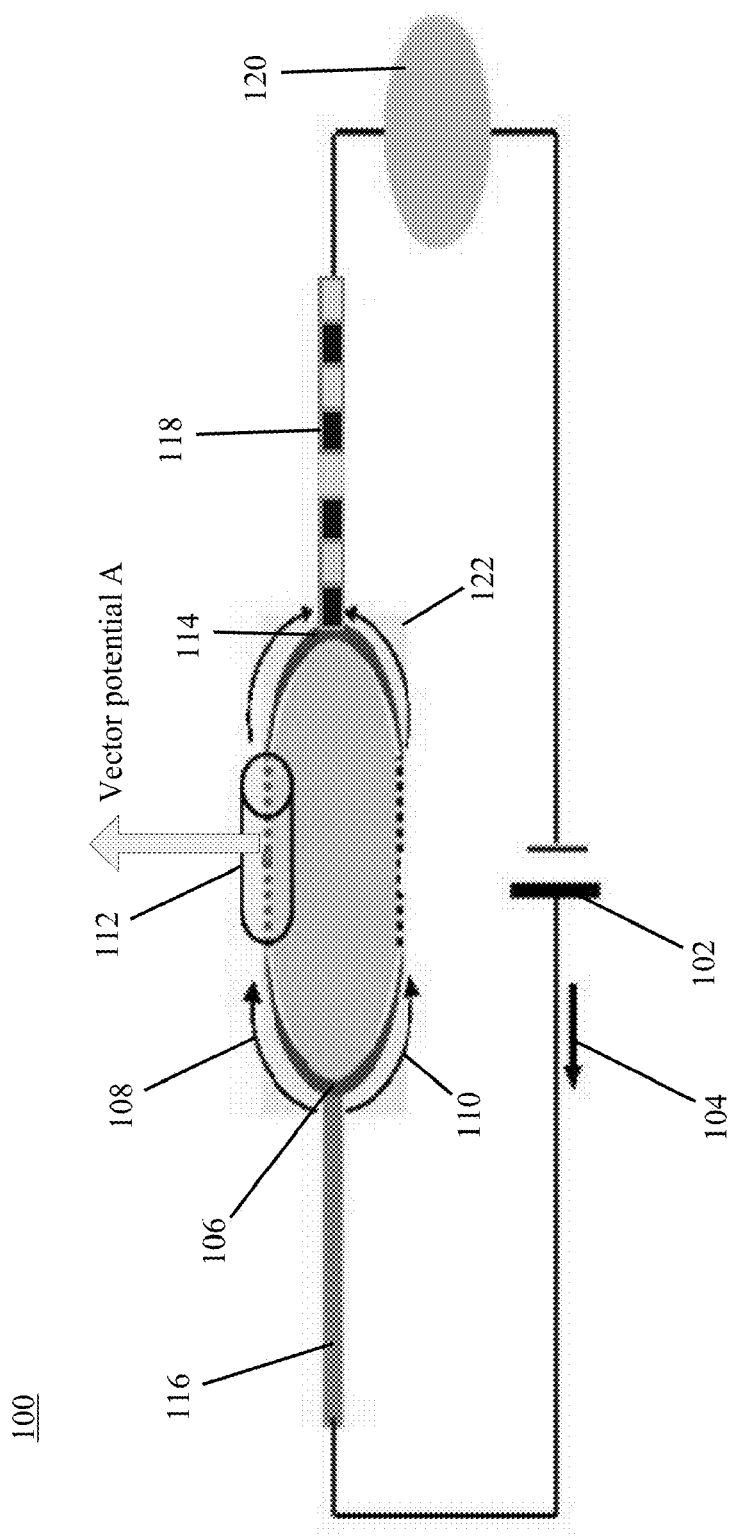
FIG. 8 illustrates an example of an AB sensor being used to determine a direction from which a signal is propagating from, in accordance with various aspects of the subject technology.

In some aspects, AB sensor 100 may also be used to determine a direction from which a signal is propagating from. FIG. 8 illustrates an example of AB sensor 100 being used to determine a direction from which a signal is propagating from, in accordance with various aspects of the subject technology. AB sensor 100, like a dipole antenna, may be highly directional. Since $\Delta\phi$ is the line integral of the vector potential A, by simply reorienting AB sensor 100, the maximum effect can be found, thereby allowing the direction from which the signal is propagating from to be determined, as illustrated by the equation below:

$$\Delta\phi = \frac{e}{\hbar}\oint d\vec{r}\cdot\vec{A}(\vec{r}) \qquad (4)$$

Thus, AB sensor 100 is configured to be oriented such that a direction of the signal can be determined based on the vector potential A of the signal.

According to certain aspects, once the signal has been detected by AB sensor 100, pattern recognition or other suitable post-processing techniques may be used to eliminate noise. Since AB effect is a non-quantity-exchanging phenomena, the state function of the electron beams do not necessarily need to collapse in the detection process, thus allowing the recovery of the entire state function, which is ideal for pattern recognition. For a sensor as sensitive as AB sensor 100, many background signals may be detected, thereby generating clutter. For example, sources of ambient noise may include electromagnetic radiation noise, quantum mechanical noise (e.g., quantum jitters and vacuum fluctuation), thermal noise, and mechanical noise. The signal to noise ratio (SNR) of AB sensor 100 may be a sensitive function of the application of AB sensor 100. For example, when AB sensor 100 is used for mind reading applications, only EM noise needs to be accounted for. In this case, AB sensor 100 is not sensitive to thermal, quantum mechanical, or mechanical noise.

For example, only EM sources of noise needs to be accounted for when AB sensor 100 is used for sensing EM signals. Once the nature of the desired signal is determined, AB sensor 100 may be tuned and filters may be used to get rid of unwanted signals (noise). The tuning may be based on the overall characteristics of the signal (e.g., pulse duration, polarization, chirality, parity, etc.). In some aspects, the filters may be designed according to amplitude, frequency, polarization, and/or phase conjugation. In one example, signals emanating from a nerve system may be so low in frequency (e.g., within the kilohertz range) that a quasi-static approximation, involving magnetic field only, is fully adequate. This may reject 99.5% of the ambient noise in normal environments. An amplitude filter may further reduce the noise to less than 1/10 of 1% (<0.001).

According to certain aspects, the SNR for a particular AB sensor can be calculated according to the following steps. First, the SNR may be defined mathematically as $P_s/P_n$, where $P_s$ is the average power of the desired signal, and $P_n$ is the average power of the undesired noise. These power levels may be measured at the same points and within the same bandwidth of the sensor. Next, the root mean square (RMS) of the signal and the noise are obtained. Then the SNR can be calculated when the power of both the signal and the noise is measured across the same impedance. Under this condition, the SNR may be calculated as SNR=$P_s/P_n$=$(R_s/R_n)^2$, where $R_s$ is a measurement of an RMS amplitude (e.g., typically voltage) of the signal, and $R_n$ is a measurement of an RMS amplitude of the noise. The SNR, usually given in dB, can be defined as SNR (dB)=10 $\log_{10}$ ($P_s/P_n$), so SNR (dB)=10 $\log_{10}$ $(R_s/R_n)^2$=2(10)$\log_{10}(R_s/R_n)$=20 $\log_{10}(R_s/R_n)$. As an example, based on the foregoing steps, an estimate for the SNR of an AB sensor at very low frequencies was carried out and calculated to be 320 dB. Because of the very strong nature of the AB effect, the SNR may be very high, and the quantum efficiency approaches one. For example, given an electro potential difference of only 1 nanovolt and interface time of 1 microsecond, a phase shift of nearly $\pi/2$ radians may be produced. According to certain aspects, signals of electrostatic, magnetostatic, or electromagnetic nature can be detected by AB sensor 100. Pattern recognition and Fourier transform may be used to discern the desired signal from background noise.

Figure 9:
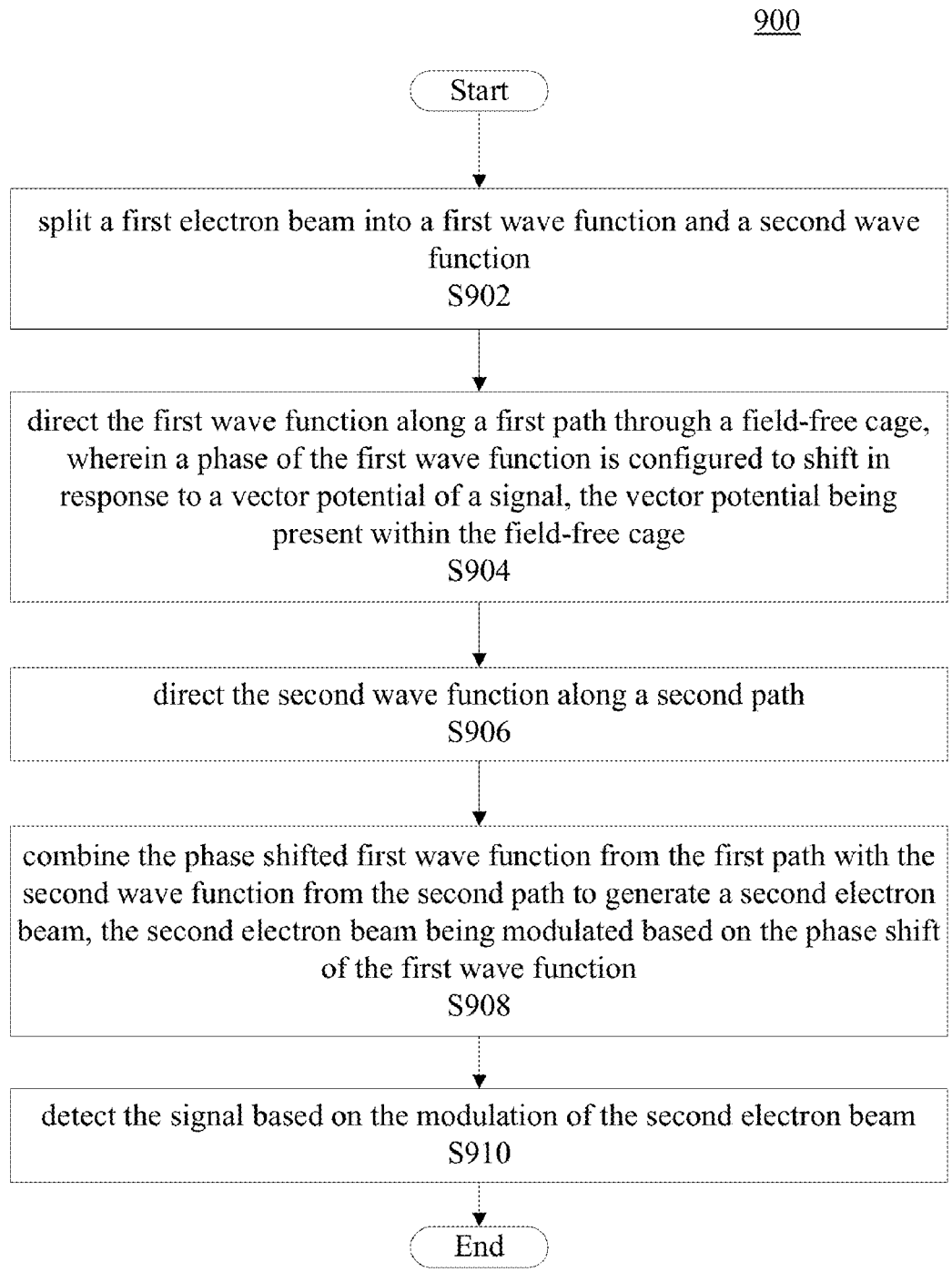
FIG. 9 illustrates an example of a method for detecting a signal, in accordance with various aspects of the subject technology.

FIG. 9 illustrates an example of method 900 for detecting a signal, in accordance with various aspects of the subject technology. Method 900 comprises splitting a first electron beam into a first wave and a second wave (S902). Method 900 also comprises directing the first wave along a first path through a field-free cage (S904). A phase of the first wave is configured to shift in response to a vector potential of a signal, which is present within the field-free cage. Method 900 also comprises directing the second wave along a second path (S906), and combining the phase shifted first wave from the first path with the second wave from the second path to generate a second electron beam (S908). The second electron beam is modulated based on the phase shift of the first wave. Method 900 also comprises detecting the signal based on the modulation of the second electron beam (S910).

Utilizing the AB effect, AB sensor 100 may be nearly a million times more sensitive than conventional sensors. This extraordinary sensitivity may stem from the fact that no energy is exchanged in the process. The effect may be geometrical and purely quantum mechanical without a counterpart in classical physics. Using AB sensor 100, signals of orders of magnitude below current thresholds may be detected. For example, AB sensor 100 may pick up intelligence signals from electronically hardened, well protected adversary assets hundreds of miles away. AB sensor 100 may also be used for non-invasive hardware diagnosis.

In addition to sensors, energy-free phase-modifying effects may find applications in interaction-free transactions such as remote sensing, no-momentum-exchange elastic collisions, spy craft, and enhancements to self-organized order. In some aspects, using the inverse AB effect where the passage of a beam of charged particles may modify the phase of an alternating magnetic or electrical field, communications may be decoded or altered (e.g., applications in decoding or altering adversary's radio communications).

Utilizing AB sensor 100, innermost electronics signals may be sensed from well protected hardware, which may be hundreds of miles away. Furthermore, AB sensor 100 may be so sensitive that it can detect waves emanating from a human's nerve system. Thus, a person's mind may be read without the person realizing it. Based on the direction and strength of a signal, distribution of currents (e.g., thoughts) in the brain can be mapped out.

Mathematical Detail

The most general non-relativistic Hamiltonian governing the physics of high flux AB phenomena is given by:

$$H = \frac{p^2}{2M} + V(q) + \sum_k C_k q_k q + \sum_k \left(\frac{p_k^2}{2m_k} + \frac{1}{2}m_k\omega_k^2 q_k^2\right) + \frac{1}{2}\sum_k \frac{C_k^2}{m_k\omega_k^2}q^2, \qquad (5)$$

with the current density and charge density given by:

$$J(\omega) \equiv \frac{\pi}{2} \sum_k \frac{C_k^2}{m_k \omega_k} \delta(\omega - \omega_k) \quad (6)$$

and $$\tilde{\rho}(x, y, t) = \int dR \langle xR|\rho(t)|yR\rangle = \quad (7)$$

$$\int\int\int\int\int dx' dy' dR' dQ' dR K(x, R, t; x', R', 0) \times$$

$$K^*(y, R, t; y', Q', 0)(x'R'|\rho(0)|y'Q')$$

Assuming the trace of $\rho_0$ being 1, r(x,y,t) may reduce to:

$$\tilde{\rho}(x, y, t) = \int\int dx' dy' J(x, y, t; x', y', 0) \times \rho_0^{(S)}(x', y'), \quad (8)$$

where, $$J = \quad (9)$$

$$\overline{\int\int_{x'}^{x}} \overline{\int\int_{y'}^{y}} Dx Dy \exp\left(\frac{i}{\hbar} \overline{S}_A[x]\right) \exp\left(-\frac{i}{\hbar} \overline{S}_A[y]\right) \times F([x], [y], x', y'),$$

where, $$F = \int\int\int dR' dQ' dR R_{\rho_{eq}}^{(RS)}(x', R'; y', Q') \times G([x], [y], R, R', Q') \quad (10)$$

and G is the assumed Gaussian function for the density matrix p:

$$G = \prod_a \left\{ \frac{m_a \omega_a}{2\pi\hbar \sin(\omega_a t)} \right. \quad (11)$$

$$\exp\left[\frac{i}{\hbar} \frac{m_a \omega_a}{\sin(\omega_a t)} \left(\cos(\omega_a t) \frac{(R_a'^2 - Q_a'^2)}{2} - R_a(R_a' - Q_a') + \right.\right.$$

$$\frac{R_a}{m_a \omega_a} \int_0^t C_a[x(t') - y(t')] \sin(\omega_a t') dt' +$$

$$\frac{1}{m_a \omega_a} \int_0^t C_a[R_a' x(t') - Q_a' y(t')] \sin[\omega_a(t - t')] dt' -$$

$$\left.\left.\frac{C_a^2}{m_a^2 \omega_a^2} \int_0^t d\tau \int_0^\tau d\sigma [x(\tau)x(\sigma) - y(\tau)y(\sigma)] \sin[\omega_a(t-\tau)] \sin(\omega_a \sigma)\right]\right\}$$

Implementing additional simplifying assumptions, F([x], [y],x,y) may be reduced to:

$$F([x], [y], x', y') = \mathcal{F}[x, y] \overline{\int\int_{y'}^{x'}} Dz \exp\left(-\frac{1}{\hbar} S_0^{[E]}[z]\right) \times \quad (12)$$

-continued $$\prod_a \left[ \frac{\mathrm{csch}(\omega_a U/2)}{2} \exp\left(\frac{C_0}{4 m_a \omega_a \hbar} \int_{-\infty}^\infty du \int_0^U du' \exp[-\omega_a|u - u'|] z(u) z(u')\right) \times \right.$$

$$\exp\left(-\frac{C_a(A_a - B_a) e^{\omega_a U/2}}{2\hbar \sinh(\omega_a U/2)} \int_0^t [x(t') - y(t')]\right.$$

$$\sin(\omega_a t') dt' + i \frac{C_a(A_a + B_a) e^{\omega_a U/2}}{2\hbar \sinh(\omega_a U/2)}$$

$$\left.\left.\int_0^t [x(t') - y(t')] \cos(\omega_a t')] \cos(\omega_a t')] dt'\right)\right].$$

and finally, with some additional assumptions, equation (12) may reduce to:

$$F([x], [y], x', y') = \quad (13)$$

$$\mathcal{F}[x, y] \overline{\int\int_{y'}^{x'}} Dz \exp\left(-\frac{1}{\hbar} S_0^{[E]}[z]\right) \times \exp\left(\frac{1}{4\pi\hbar} \int_0^U du \int_{-\infty}^\infty du'\right.$$

$$\int_0^\infty d\omega J(\omega) \exp(-\omega|u - u'|) [z(u) - z(u')]^2 \times$$

$$\left.\exp\left(\frac{1}{\pi\hbar} \int_0^U z(u) f(u) du\right),\right.$$

where $$f(u) = \int_0^t dt' [x(t') - y(t')] \quad (14)$$

$$\int_0^\infty d\omega J(\omega) \sin(\omega t') [\coth(\omega U/2) \sinh(\omega u) - \cosh(\omega u)] +$$

$$i \int_0^t dt' [x(t') - y(t')]$$

$$\int_0^\infty d\omega J(\omega) \cos(\omega t') [\coth(\omega U/2) \cosh(\omega u) - \sinh(\omega u)]$$

Limiting the analysis to non-interacting, two-dimensional constituents, and assuming linearity (no strong fields), a simple relation between the phase shift and the magnetic potential to be detected may be given by:

$$\Delta\phi = \frac{e}{\hbar} \oint d\vec{r} \cdot \vec{A}(\vec{r}) \quad (15)$$

which is the same as equation (4) described above.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these configurations will be readily apparent to those skilled in the art, and generic principles defined herein may be applied to other configurations. Thus, many changes and modifications may be made to the subject technology, by one having ordinary skill in the art, without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. An Aharonov-Bohm (AB) sensor comprising:
    a beam splitter configured to split a first electron beam into a first wave and a second wave, the beam splitter further configured to direct the first wave along a first path through a field-free cage, wherein a phase of the first wave is configured to shift in response to a vector potential of a signal, the vector potential being present within the field-free cage;
    a beam combiner configured to combine the phase shifted first wave with the second wave to generate a second electron beam, the second electron beam being modulated based on the phase shift of the first wave; and
    a detector configured to receive the second electron beam and to detect the signal based on the modulation of the second electron beam.

2. The AB sensor of claim 1, wherein the beam splitter is configured to direct the second wave along a second path.

3. The AB sensor of claim 2, wherein the field-free cage is coupled to the beam splitter.

4. The AB sensor of claim 3, wherein the beam combiner is coupled to the field-free cage and configured to combine the phase shifted first wave from the first path with the second wave from the second path.

5. The AB sensor of claim 2, further comprising a vacuum housing, wherein the first path and the second path are disposed within the vacuum housing.

6. The AB sensor of claim 5, wherein at least one of the field-free cage, the beam splitter, and the beam combiner is disposed within the vacuum housing.

7. The AB sensor of claim 5, wherein the vacuum housing is sized such that a coherence length of each of the first wave and the second wave when directed along the first path and the second path, respectively, is at least 1 millimeter.

8. The AB sensor of claim 7, wherein the coherence length of each of the first wave and the second wave is a distance over which a wave function of the first wave and a wave function of the second wave remain phase dependent on one another.

9. The AB sensor of claim 5, wherein the vacuum housing is configured to substantially preserve a phase dependence between a wave function of the first wave and a wave function of the second wave when the first wave and the second wave propagate along the first path and the second path, respectively, without using cryogenics.

10. The AB sensor of claim 5, wherein the vacuum housing is configured to substantially preserve a phase dependence between a wave function of the first wave and a wave function of the second wave when the first wave and the second wave propagate along the first path and the second path, respectively, in a temperature range between 15 degrees Celsius and 25 degrees Celsius.

11. The AB sensor of claim 1, wherein the detector is configured to detect the signal without modifying an energy of the signal.

12. The AB sensor of claim 1, wherein the beam splitter is configured to split the first electron beam one electron at a time.

13. The AB sensor of claim 1, wherein the field-free cage is configured to exclude at least one of an electromagnetic field, an electric field, and a magnetic field external to the field-free cage.

14. The AB sensor of claim 1, wherein the beam splitter is configured to direct the second wave along a second path through the field-free cage, and wherein a phase of the second wave is configured to shift in response to the vector potential of the signal.

15. The AB sensor of claim 14, wherein the phase of the first wave and the phase of the second wave are configured to shift in opposite directions.

16. The AB sensor of claim 15, wherein the beam combiner is configured to combine the phase shifted first wave with the phase shifted second wave to generate the second electron beam.

17. The AB sensor of claim 1, wherein the AB sensor is configured to be oriented such that a direction of the signal can be determined based on the vector potential of the signal.

18. A method for detecting a signal, the method comprising:
splitting a first electron beam into a first wave and a second wave;
directing the first wave along a first path through a field-free cage, wherein a phase of the first wave is configured to shift in response to a vector potential of a signal, the vector potential being present within the field-free cage;
directing the second wave along a second path;
combining the phase shifted first wave from the first path with the second wave from the second path to generate a second electron beam, the second electron beam being modulated based on the phase shift of the first wave; and
detecting the signal based on the modulation of the second electron beam.

19. The method of claim 18, further comprising housing the first path and the second path within a vacuum housing.

20. An Aharonov-Bohm (AB) sensor comprising:
a beam splitter configured to split a first electron beam into a first wave and a second wave, the beam splitter further configured to direct the first wave along a first path through a field-free cage and to direct the second wave along a second path, wherein a phase of the first wave is configured to shift in response to a vector potential of a signal, the vector potential being present within the field-free cage;
a vacuum housing, wherein the first path and the second path are disposed within the vacuum housing, the vacuum housing sized such that a coherence length of each of the first wave and the second wave when directed along the first path and the second path, respectively, is at least 1 millimeter;
a beam combiner configured to combine the phase shifted first wave from the first path with the second wave from the second path to generate a second electron beam, the second electron beam being modulated based on the phase shift of the first wave; and
a detector configured to receive the second electron beam and to detect the signal based on the modulation of the second electron beam.

\* \* \* \* \*